(12) United States Patent  
Bandy et al.

(10) Patent No.: US 9,348,057 B2
(45) Date of Patent: May 24, 2016

(54) METHOD AND APPARATUS FOR CALIBRATING SENSORS THAT DETECT WAFER PROTRUSION FROM A WAFER CASSETTE

(71) Applicant: INTERNATIONAL BUSINESS MACHINES CORPORATION, Armonk, NY (US)

(72) Inventors: John J. Bandy, Cambridge, VT (US); Graham M. Bates, Waterbury, VT (US); Bradley M. Mahan, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/340,060

(22) Filed: Jul. 24, 2014

(65) Prior Publication Data

US 2016/0025893 A1   Jan. 28, 2016

(51) Int. Cl.
*G01B 11/14* (2006.01)
*G01V 8/12* (2006.01)
(52) U.S. Cl.
CPC ....................................... *G01V 8/12* (2013.01)
(58) Field of Classification Search
None
See application file for complete search history.

(56) References Cited

U.S. PATENT DOCUMENTS

| | | | |
|---|---|---|---|
| 5,225,691 A | 7/1993 | Powers et al. | |
| 5,301,179 A * | 4/1994 | Okamoto | G11B 17/0438 720/636 |
| 5,592,295 A | 1/1997 | Stanton et al. | |
| 6,303,939 B1 | 10/2001 | Chung et al. | |
| 6,356,091 B1 | 3/2002 | Nimtz et al. | |
| 7,068,003 B2 | 6/2006 | Cho | |
| 7,202,491 B2 | 4/2007 | Garssen et al. | |
| 7,387,892 B2 * | 6/2008 | Kiesel et al. | 435/288.7 |
| 8,614,797 B2 | 12/2013 | Hellwig et al. | |

FOREIGN PATENT DOCUMENTS

| | | |
|---|---|---|
| JP | 11204612 | 7/1999 |
| KR | 20070028196 | 3/2007 |
| KR | 101318934 | 10/2013 |

* cited by examiner

*Primary Examiner* — Tri T Ton
(74) *Attorney, Agent, or Firm* — Schmeiser, Olsen & Watts; Steven Meyers

(57) ABSTRACT

A calibration gauge, an apparatus and a method for calibrating sensors that detect wafer protrusion from a wafer cassette using the calibration gauge. The calibration gauge includes a disk having a first region which is a circular sector of central angle A1 having a constant radius R1 about a center and an integral second region of increasing radius about the center, the increasing radius increasing from R1 to R2 through a central angle A2, wherein R2 is greater than R1 and A1+A2 equals 360°.

19 Claims, 6 Drawing Sheets

METHOD AND APPARATUS FOR CALIBRATING SENSORS THAT DETECT WAFER PROTRUSION FROM A WAFER CASSETTE

BACKGROUND

The present invention relates to the field of tools that utilize wafers in cassettes; more specifically, it relates to a method and apparatus for calibrating sensors that detect wafer protrusion from a wafer cassette.

Many wafer cassette based tools have an optical wafer protrusion sensor in the load/unload chamber to detect a wafer which is protruding too far out of its slot after the cassette has been loaded into the load/unload chamber. Wafer protrusion is caused by the wafer not being fully seated in its slot in the wafer cassette. After the cassette is loaded, the thru beam sensor will alarm the tool if there are any wafers breaking the beam and prevent the tool from running. If not calibrated correctly, the handling of this wafer into the tool can cause mishandling of the wafer resulting in a breakage or tool errors. Currently, in order to calibrate the sensors, the wafer is manually pushed out of its slot an estimated distance or a measured distance using a flat edge and ruler to vary the distance with reference to another point on the cassette. This method is not precise and time consuming. Accordingly, there exists a need in the art to mitigate the deficiencies and limitations described hereinabove.

BRIEF SUMMARY

A first aspect of the present invention is an apparatus, comprising: a wafer cassette comprising a top, a bottom, opposite first and second ends and opposite sidewalls between the first and second ends, the cassette open at the top and the bottom, a plurality of slots formed in the sidewalls, each slot adapted to hold a circular wafer; a calibration gauge in the form of a disk having a first region which is a circular sector of central angle A1 having a constant radius R1 about a center and an integral second region of increasing radius about the center, the increasing radius increasing from R1 to R2 through a central angle A2, wherein R2 is greater than R1 and A1+A2 equals 360°; and wherein the disk is removeably positioned in a slot of the plurality slots and rotatable about the center, the second region of the disk extending past the opposite ends and the top of the wafer cassette.

A second aspect of the present invention is a method, comprising: providing a calibration gauge comprising a disk having a first region which is a circular sector of central angle A1 having a constant radius R1 about a center and an integral second region of increasing radius about the center, the increasing radius increasing from R1 to R2 through a central angle A2, wherein R2 is greater than R1 and A1+A2 equals 360°; providing a wafer cassette comprising a top, a bottom, opposite first and second ends and opposite sidewalls between the first and second ends, the cassette open at the top and the bottom, a plurality slots formed in the sidewalls, each slot adapted to hold a circular wafer; placing the calibration gauge in a slot of the plurality of slots in the wafer cassette, the calibration gauge rotatable about the center, the second region of the disk extending past the opposite ends and the top of the wafer cassette; placing the wafer cassette with the calibration gauge in a load/unload station having an optical wafer protrusion system comprising a sender for generating an optical beam and a receiver for receiving the optical beam, the sender positioned proximate to the first end of the cassette and the receiver proximate to the second end of the wafer cassette; and rotating the calibration gauge about it center until the beam is broken by the calibration gauge and determining a difference between R1 and a distance from the center of the calibration gauge to the perimeter of the second region when the beam is broken.

A third aspect of the present invention is a device, comprising: a disk having a first region which is a circular sector of central angle A1 having a constant radius R1 about a center and an integral second region of increasing radius about the center, the increasing radius increasing from R1 to R2 through a central angle A2, wherein R2 is greater than R1 and A1+A2 equals 360°.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

DETAILED DESCRIPTION

The present invention utilizes a calibration gauge to calibrate the optical wafer protrusion system in the load port of a wafer processing tool. The calibration gauge is used to calibrate the distance between an imaginary line which joins the sensors of the optical wafer protrusion system and the edge of the wafers in a wafer cassette.

The calibration gauge includes a first section with a constant radius (that of a production wafer) and a second section whose radius gradually increases to a radius greater than the radius of a production wafer thus simulating the amounts a wafer can protrude beyond the nominal wafer position in the cassette by rotating the calibration gauge.

In one example, the wafers are semiconductor wafers used to fabricate integrated circuit tools. Examples of wafers include, but are not limited to, silicon wafers, semiconductor wafers, metal wafers, glass wafers, plastic wafers, ceramic wafers, wafers comprising multiple materials and wafers comprising layers of different materials. Semiconductor wafers are normally described by the nominal diameter of the wafer and that convention will be applied to all wafers regardless of the composition of the wafer. Common semiconductor wafer sizes are 100 mm, 125 mm, 150 mm, 200 mm and 300 mm. Examples of wafer process tools include, but are not limited to, measurement tools (e.g., dimension, film thickness, alignment) grinding tools, chemical-mechanical-polish (CMP) tools, plasma etch tools, reactive ion etch (RIE) tools, chemical vapor deposition (CVD) tools, evaporative deposition tools, sputter deposition tools and other integrated circuit fabrication tools.

Figure 1A:
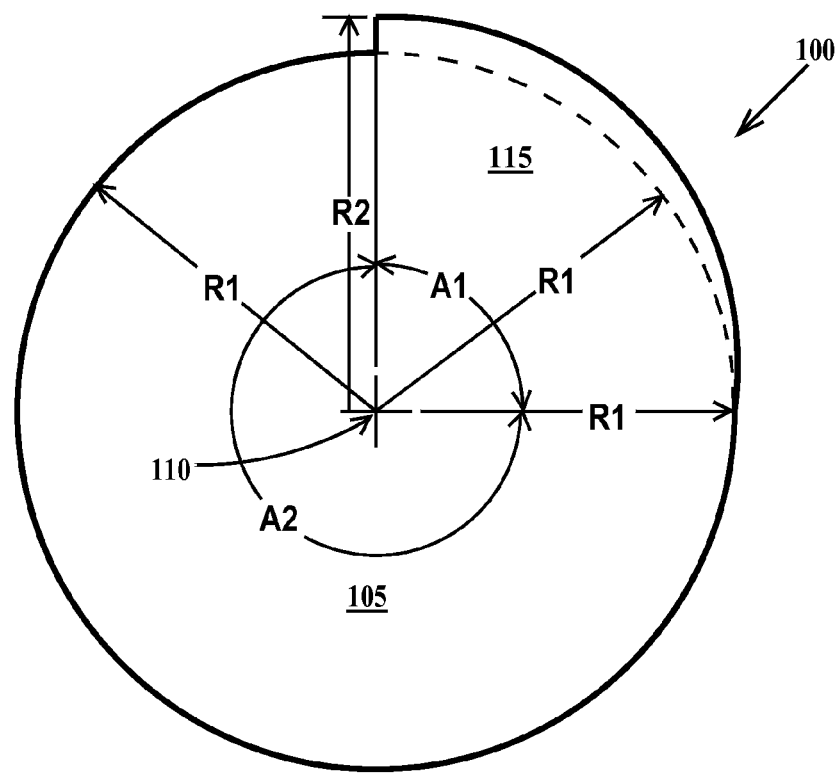
FIG. 1A is a top view and FIG. 1B is a side view illustrating the physical geometry of an exemplary calibration gauge according to an embodiment of the present invention.
Figure 1B:

FIG. 1A is a top view and FIG. 1B is a side view illustrating the physical geometry of an exemplary calibration gauge according to an embodiment of the present invention. In FIG. 1A, a calibration gauge 100 comprises a first region 105 (which is a circular sector) having a constant radius R1 about a center 110 and an integral second region 115 of increasing radius about center 110. The radius in second section 115 increases from R1 to R2 over an angle A1. The radius of the first section is constant over an angle 360°−A1. R2 is greater than R1 and A1 is greater than 0° and no greater than 180°. In one example, the increase of the distance from the center 110 and the outer perimeter of second region 115 (the inner perimeter of second region 115 is a circular arc section) increases uniformly from R1 to R2. While FIG. 1A shows a smoothly curved outer perimeter of second region 115, the outer perimeter of the second region may assume other geometries, such as a series of abutting wedges or notches of varying size or of varying length from center 110.

The value of R1 is the same as the radius (or half the diameter) of the wafers that the process tool to be calibrated using calibration gauge 100 processes. For example, for 100 mm wafers R1 is 50 mm, for 200 mm wafers R1 is 100 mm, and for 300 mm wafers R1 is 150 mm. The value R2 is equal to R1+X where X is a predetermined maximum protrusion of an actual wafer in a wafer cassette. In one example, A1 is equal to 90°. In FIG. 1B, calibration gauge 100 has a thickness T. In one example, T1 is equal to the thickness of the wafer that the process tool to be calibrated using calibration gauge 100 processes. For example, for 100 mm wafers T1 is 525 microns, for 200 mm wafers T1 is 725 microns, and for 300 mm wafers, T1 is 775 microns. It is preferred that T1 be equal to the thickness of the wafers to be processed so as to fit perfectly into a wafer cassette, but it may be less than the thickness of the wafers to be processed. Calibration gauge 100 may be formed from, but not limited to, polymer, metal, glass, ceramic or combinations thereof.

Figure 2:
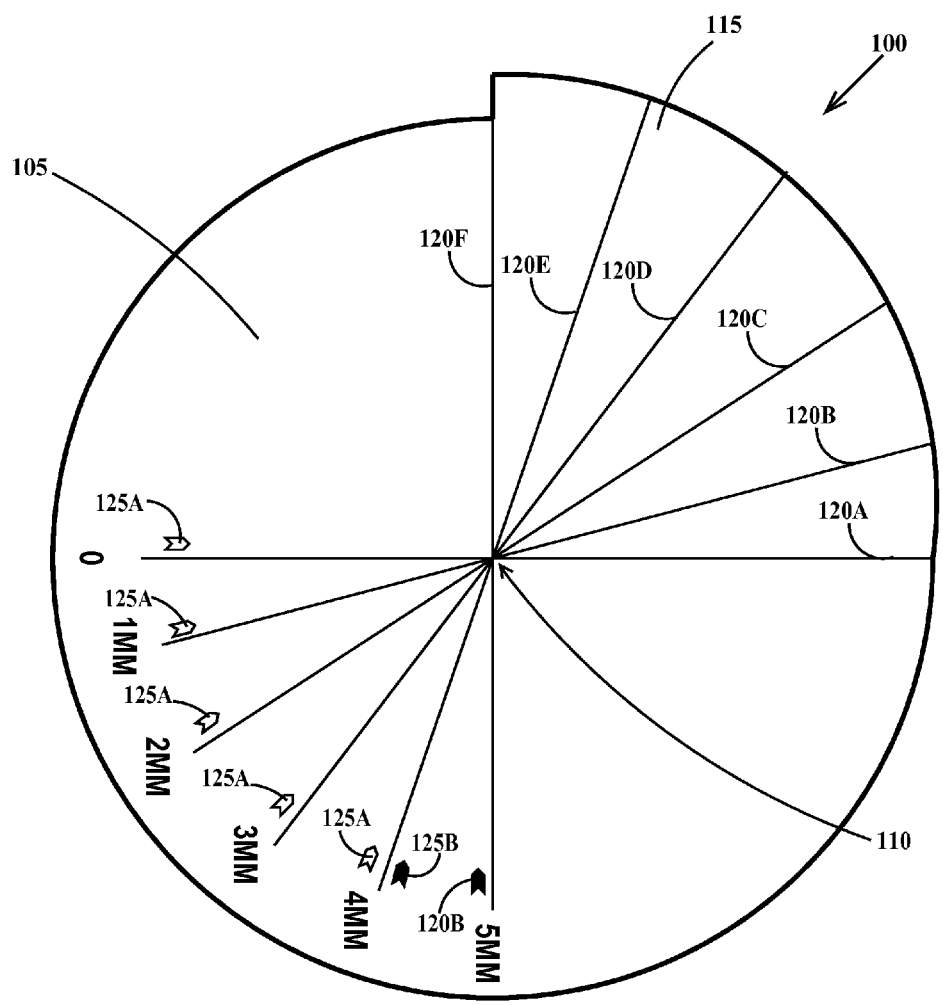
FIG. 2 is a top view illustrating the calibration markings relative to the physical geometry of the exemplary calibration gauge of FIGS. 1A and 1B according to an embodiment of the present invention.

FIG. 2 is a top view illustrating the calibration markings relative to the physical geometry of the exemplary calibration gauge of FIGS. 1A and 1B according to an embodiment of the present invention. In FIG. 2, a series of six straight sight lines 120A, 120B, 120C, 120D, 120E and 120F that pass through center 110 are formed on or engraved in the surface of calibration gauge 100. Opposite ends of each of sight lines 120A, 120B, 120C, 120D, 120E and 120F terminate at or proximate to the perimeter of calibration gauge 100. Also formed on or engraved in the surface of calibration gauge 100 are optional indicia 125A and 125B that are aids in determining in or out of specification protrusion values.

In the example calibration gauge 100 of FIG. 2, first sight line 120A has a first end that terminates at the perimeter of second region 115 and has length R1 (see FIG. 1A) from the perimeter to center 110 and is marked 0 at its opposite end. Second sight line 120B is rotated 18° from first sight line 120A, has a first end that terminates at the perimeter of second region 115, has length R1+1 mm from the perimeter to center 110 and is marked 1 MM at its opposite end. Third sight line 120C is rotated 18° from second sight line 120B, has a first end that terminates at the perimeter of second region 115, has length R1+2 mm from the perimeter to center 110 and is marked 2 MM at its opposite end. Fourth sight line 120D is rotated 18° from third sight line 120C, has a first end that terminates at the perimeter of second region 115, has length R1+3 mm from the perimeter to center 110 and is marked 3 MM at its opposite end. Fifth sight line 120E is rotated 18° from fourth sight line 120D, has a first end that terminates at the perimeter of second region 115, has length R1+4 mm from the perimeter to center 110 and is marked 4 MM at its opposite end. Sixth and last sight line 120F is rotated 18° from fifth sight line 120E, has a first end that terminates at the perimeter of second region 115, has length R1+5 mm from the perimeter to center 110 and is marked 5 MM at its opposite end. Thus, R2 (see FIG. 1A)=R1+5 mm and first sight line 120A and last sight line 120F are perpendicular.

In the example of a calibration gauge for 200 mm wafers, the respective lengths of sight lines 120A, 120B, 120C, 120D, 120E and 120F from center 115 to the perimeter of second region 115 are 100 mm, 101 mm, 102 mm, 103 mm, 104 mm and 105 mm. Thus the calibration gauge can be used to calibrate wafer protrusions of between 0 mm and 5 mm. If a specification calls for, for example, no greater than 4 mm of wafer protrusion then indicia 125A would indicate a pass and indicia 125B would indicate a fail as shown in FIG. 2. If a specification calls for protrusions of 3 mm±1 mm, then the 125A indicia next to the 0 and 1 mm sight lines of FIG. 2 would be changed to 125B indicia. The pass/fail indicia may be different shapes, colors, letters or combinations thereof. An alarm may take the form of an audio alarm, an indicator light alarm or an error message on a display screen of a computerized process tool controller.

While six sight lines are shown in the example of FIG. 2, there may be more or less than six. While the angle between the first sight line 120A and last sight line 120F is 90°, the angle between the first and second sight lines may be greater or less than 90°. While in the example of FIG. 2, calibration gauge will measure wafer protrusions from 0 mm to 5 mm, the calibration gauge may be designed to detect other ranges that are greater or less than 5 mm and ranges that are greater or less than 5 mm and have a minimum value greater than 0 mm.

Figure 3A:
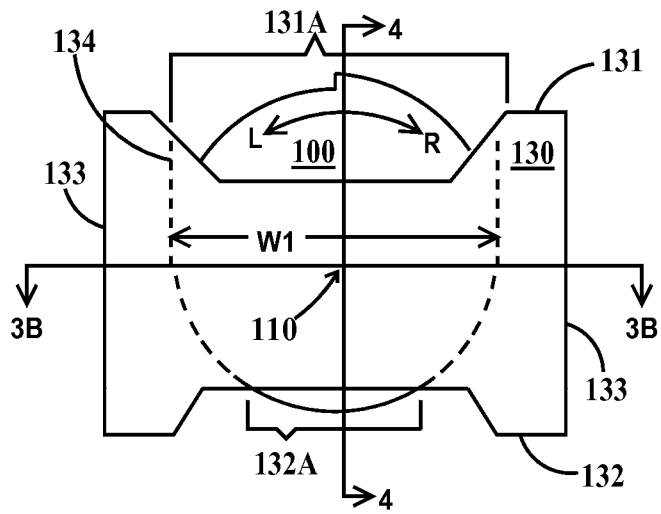
FIG. 3A is a side view and FIG. 3B is cross-section view through line 3B-3B of FIG. 3A of a wafer cassette holding a calibration gauge according to an embodiment of the present invention.
Figure 3B:
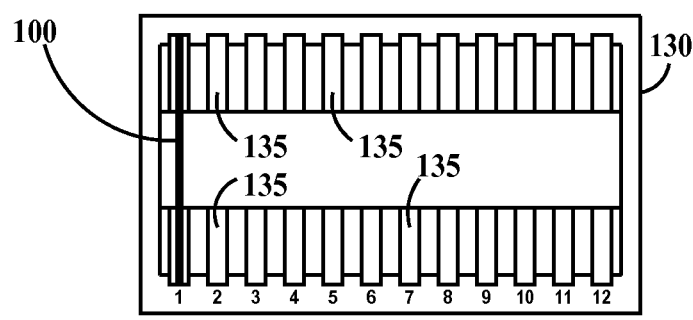

FIG. 3A is a side view and FIG. 3B is cross-section view through line 3B-3B of FIG. 3A of a wafer cassette holding a calibration gauge according to an embodiment of the present invention. In FIGS. 3A and 3B, a wafer cassette 130 includes a top 131 and a bottom 132 and opposite sides 133 is open at both top 131 and bottom 132. Formed on the opposite interior sidewalls 134 (dashed lines) are slots 135 for holding wafers. The upper half of sidewalls 133 are straight and the lower half of sidewalls 133 are curved to match the perimeter of a wafer. An opening 131A in top 131 is therefore larger than the opening 132A in bottom 132 allowing loading of wafers through the top and preventing wafers from dropping out the bottom when the loaded cassette is lifted. A calibration gauge 100 is illustrated in slot #1. In one example, the maximum width W1 of slots 135 is the same as the diameter of production wafers (e.g. twice R1, see FIG. 1A) plus a few tenths (i.e. 0.2-30) of a millimeter to prevent the wafer from become stuck in the slot. In this case, calibration gauge 100 must be positioned with sight line 120F (see FIG. 2) in the vertical direction and A1 (see FIG. 1A) and the calibration gauge can only be rotated about its center 110 in a range of between vertical and 90° to the left. By enlarging the slot to W1=R1+R2+a few tenths (i.e. 0.2-0.3) of a millimeter useable rotation can be increased a range between 90° to the right and 90° to the left. However, any cassette with a slot(s) modified to be greater than W1=R1+R2+a few tenths (i.e. 0.2-0.3) of a millimeter is not useable for production wafers. While 12 slots are illustrated in FIG. 3B, there may be more or less slots with 25 and 50 slots being conventional. In one example, cassette 130 made from molded resin.

Figure 4:
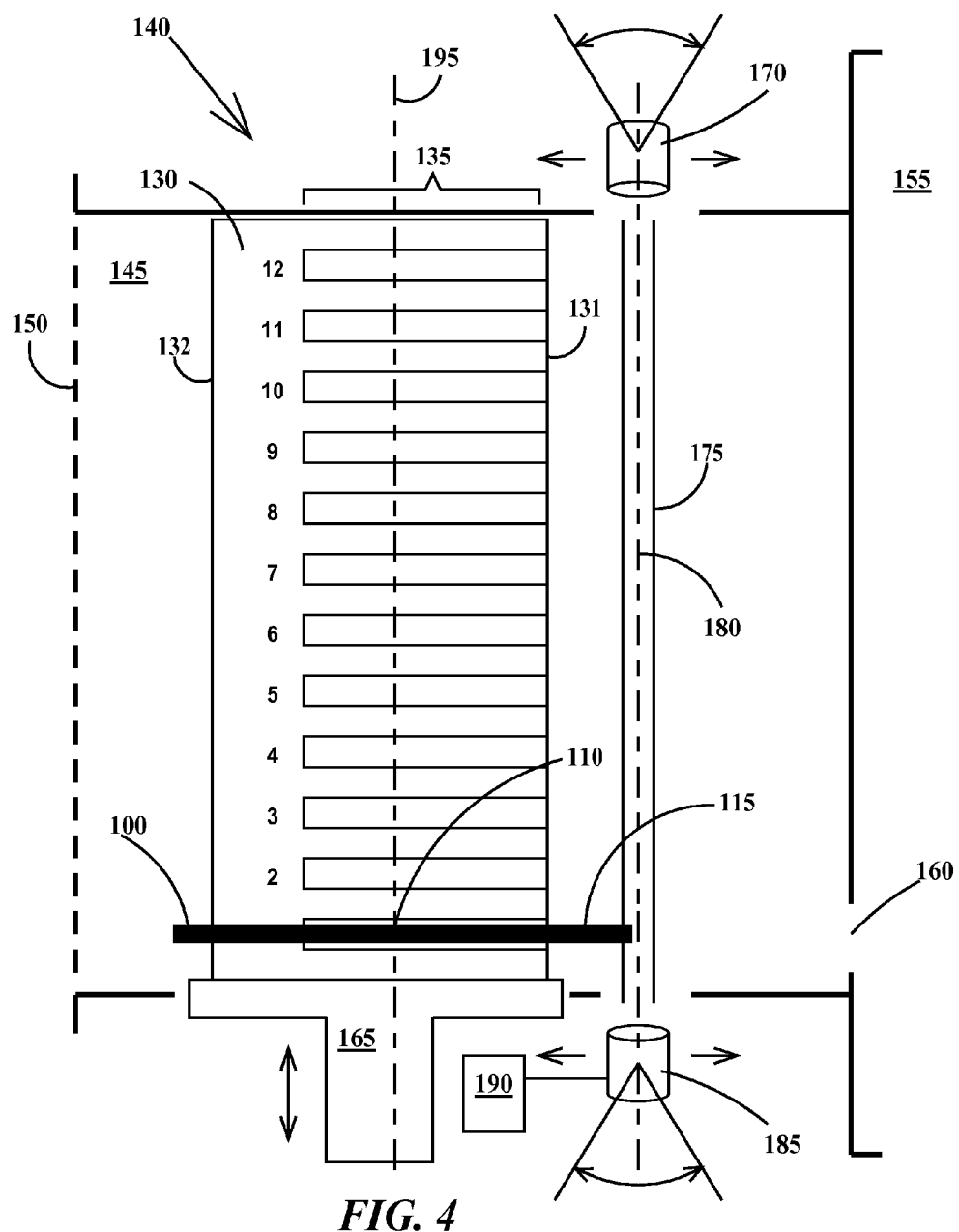
FIG. 4 is a cross-section through line 4-4 of FIG. 3A after the cassette is placed in an exemplary loading chamber of an exemplary wafer processing tool.

FIG. 4 is a cross-section through line 4-4 of FIG. 3A after the cassette is placed in an exemplary loading chamber of an exemplary wafer processing tool. In FIG. 4, a wafer processing tool 140 includes a load/unload chamber 145 with a cassette load/unload door 150 (dashed line) and a processing chamber 155 with a wafer load/unload slot or door 160 for moving a wafer between cassette 130 and the processing chamber by a wafer handling mechanism (not shown). Note an intermediate chamber may intervene between the load/unload chamber 145 and processing chamber 155 as in cluster tools that have multiple processing chambers and a single shared load/unload chamber. Cassette 100 is shown on an elevator 165 that may move up and down in the vertical direction to position one of slots 135 in line with wafer load/unload slot 160. The vertical direction is defined as a direction perpendicular to the surface of the earth.

Load unload chamber 145 is fitted with an optical wafer protrusion system comprising a sender 170 which send an optical beam 175 along an imaginary axis 180 to a receiver 185 linked to an alarm circuit 190. Sender 170 and receiver 185 are independently adjustable in the horizontal direction so they can be moved toward or away from cassette 130 and adjustable for tilt in the vertical direction relative to an imaginary axis 180 that passes through the centers of wafers when the wafers are fully seated in slots 135 of cassette 130. Axis 195 also passes through center 110 (see FIG. 1A) of calibration gauge 100 when the calibration gauge is fully seated in a wafer slot. If an edge of a wafer (or calibration gauge 100) "breaks" beam 175 tool 140 will "alarm."

During calibration load/unload cassette door 145 is opened and cassette 130 with calibration gauge 100 in a wafer slot 135 is placed on elevator 165 so top 131 of the cassette is facing process chamber 155 and bottom 132 of the cassette is facing cassette load/unload door 150. In FIG. 4, a calibration gauge 100 is shown in slot 1 of cassette 130. At least a portion of second region 115 of calibration gauge 100 extends past top 131 of cassette 130. Cassette load/unload door 150 is kept open so a human operator can rotate calibration gauge 100 by hand and read the sight lines and indicia (see FIG. 2) through the bottom opening 132A (see FIG. 3A). Calibration gauge is kept fully seated in slot 1 as it is rotated. That is, calibration gauge 100 is seated in slot 1 as far towards the bottom of the slot (toward bottom 132 of the wafer cassette) and is kept fully seated as the operator rotates the calibration around a vertical axis 195 passing through the center 110 (see FIG. 1A) of the calibration gauge. During rotation of calibration gauge 100, second region 115 of the calibration gauge may or may not break beam 175.

Figure 5A:
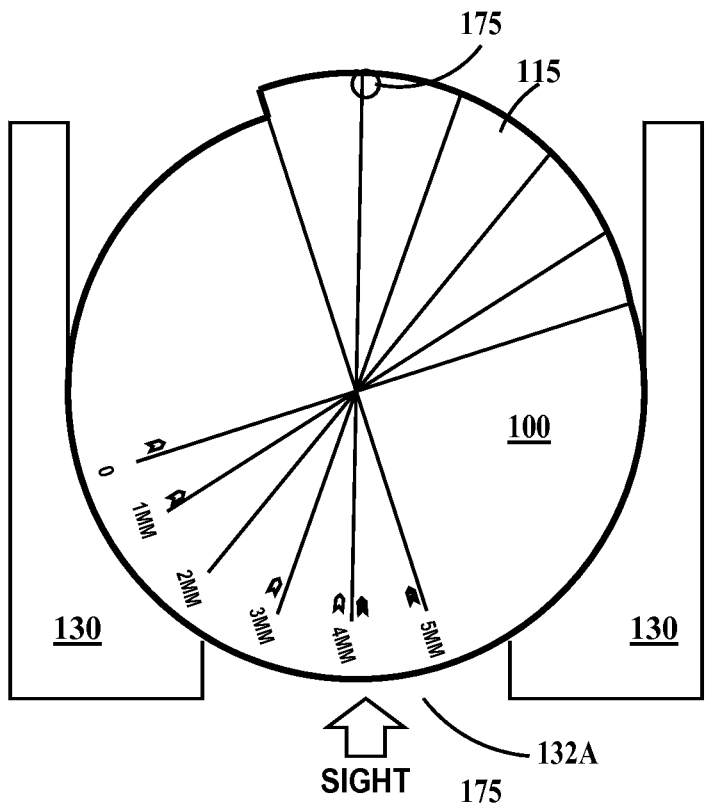
FIGS. 5A and 5B illustrate the principle of use of the calibration gauge according to an embodiment of the present invention.
Figure 5B:
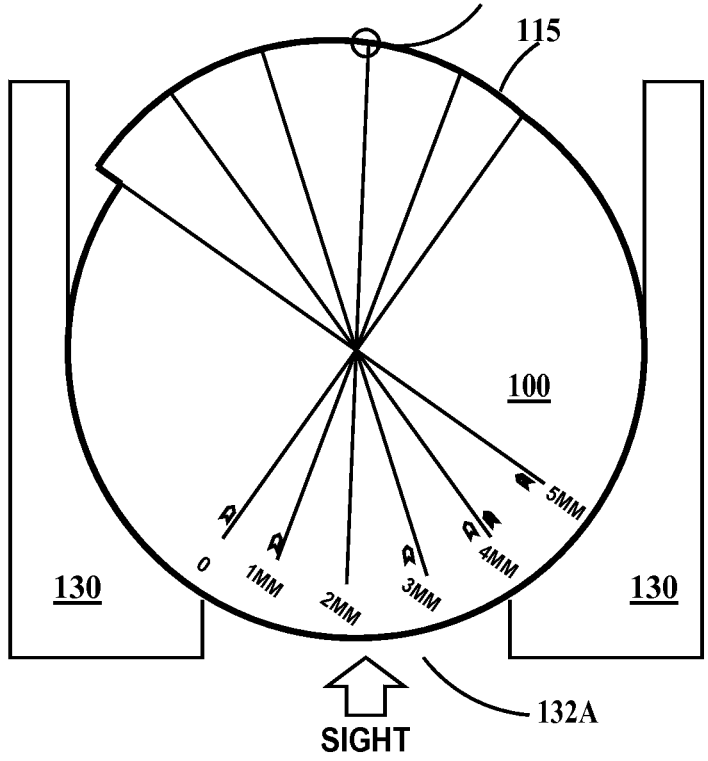

FIGS. 5A and 5B illustrate the principle of use of the calibration gauge according to an embodiment of the present invention. In FIG. 5A, calibration gauge 100 is fully seated in its slot in wafer cassette 130. The calibration gauge has been rotated to just past the 4 mm sight line and beam 175 is blocked by second region 115 of calibration gauge 100. In FIG. 5B, calibration gauge 100 is fully seated in its slot in wafer cassette 130. calibration wafer 100 has been rotated to the 2 mm sight line and the alarm there is no alarm because enough of beam 175 is not blocked by second region 115.

In a first method of use, a specification is set, for example, to no more than 4 mm of wafer protrusion. The calibration gauge would be placed with the zero sight line centered of bottom opening 132A of wafer cassette 130. There should be no alarm. The tool should alarm when the calibration gauge is rotated counterclockwise (a mirror image calibration gauge would be rotated clockwise) from the 0 sight line to just pass the 4 mm sight line. The 4 mm sight line will appear just to the left of the center of bottom opening 132A of wafer cassette 130 when the alarm should first occur. If the tool does not first alarm at just pass 4 mm an adjustment to the wafer protrusion sensor is required.

In a second method of use, a specification is set, for example, to 3 mm±1 mm of wafer protrusion. The calibration gauge would be placed with the zero sight line centered of bottom opening 132A of wafer cassette 130. There should be no alarm. As the calibration gauge is rotated counterclockwise an alarm should occur between the 2 mm and 4 mm sight. The precise protrusion can be determined by seeing which sight line or estimated fraction is centered in bottom opening 132A of wafer cassette 130. If an alarm first occurs at greater than 4 mm that would indicate that the optical wafer protrusion system would allow too much wafer protrusion and needed to be adjusted. If an alarm first occurs at less than 2 mm that would be an indication that the optical wafer protrusion system would alarm unnecessarily and needed to be adjusted.

Since the sensitivity of the optical wafer protrusion system can vary, it is not so much as fully blocking the beam that will cause the alarm, but blocking enough of the beam to cause an alarm. That is one reason the calibration gauge is useful (besides ease of use) as it automatically compensates for sensitivity differences between tools as the amount of gauge protrusion is always the same (within the tolerances of wafer cassette and wafer cassette location pins which are at most a tenth of a millimeter or less).

Figure 6:
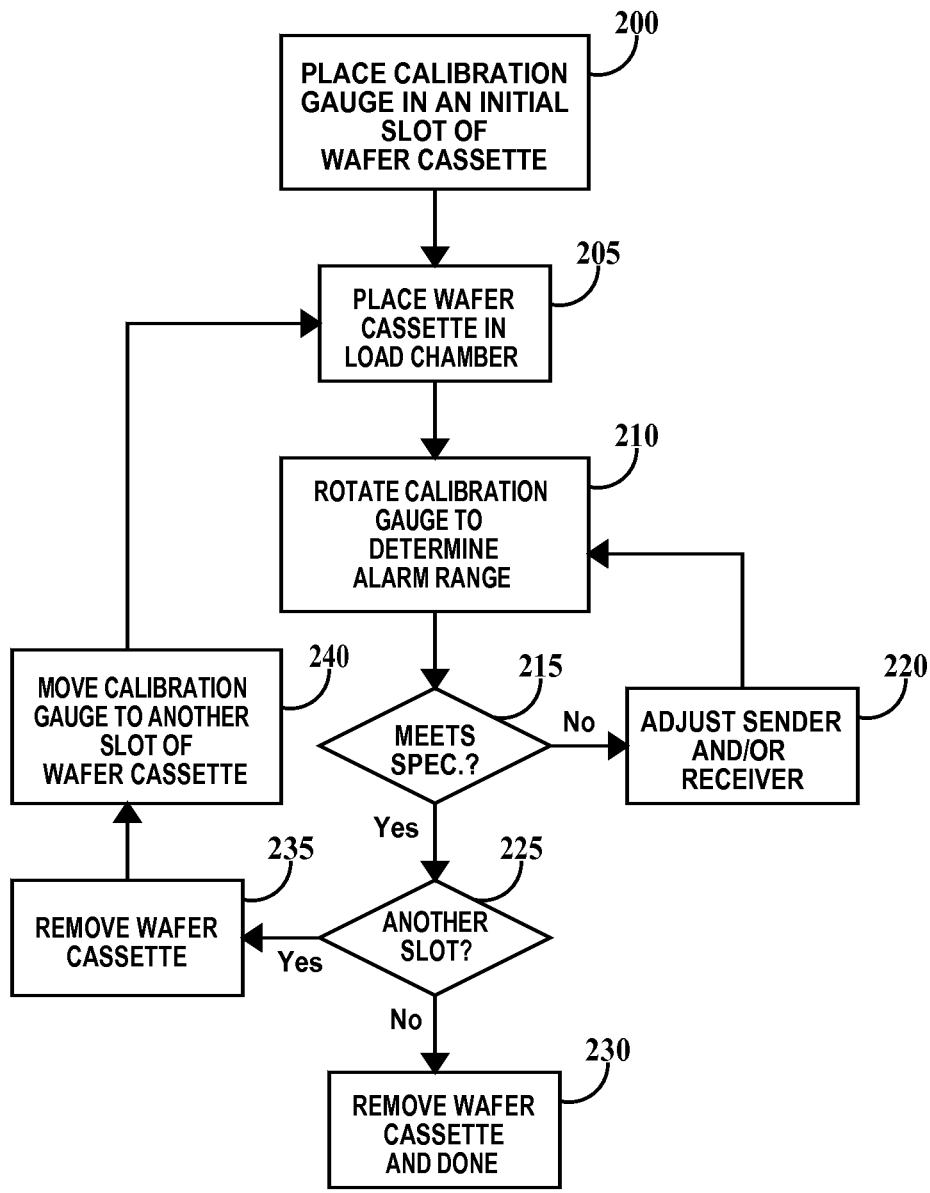
FIG. 6 is flowchart of the method of calibrating the wafer protrusion sensor of a loading station of a wafer processing tool according to an embodiment of the present invention.

FIG. 6 is flowchart of the method of calibrating the wafer protrusion sensor of a loading station of a wafer processing tool according to an embodiment of the present invention. In step 200, a calibration gauge is placed fully seated in an initial slot in a production wafer cassette or a cassette having one or more slots modified to accept the calibration gauge. The second region of the calibration gauge is placed toward the top of the wafer cassette. In step 205, the wafer cassette containing the calibration gauge is placed in the load chamber of the process chamber and the load/unload chamber door left open. In step 210, the optical wafer protrusion system is activated and either the first or the second method of use described supra is performed. It is preferred that the calibration gauge be rotated to 0 mm prior to activating the optical wafer protrusion system. In step 220, it is determined if the protrusion range meets the target. For example, if the specified target value is 3 mm±1 mm and the alarm does not occur until over 4 mm, then the target is not met. For example, if the specified target value is 3 mm±1 mm and the alarm occurs at less than 2 mm, then the target is not met. If in step 215, the target is not met then the method proceeds to step 220 otherwise to step 225. In step 225 the position of the sender and/or receiver of the optical wafer protrusion system are adjusted based on the reading obtained in step 210 and the method loops back to step 210. Returning to step 215, if in step 215 the target is met then the method proceeds to step 225. In step 225, it is determined if the calibration needs to performed in another slot position, if not the method proceeds to step 230 and the wafer cassette is removed and the method terminates. If, in step 225, it is determined if the calibration needs to performed in another slot position then the method proceeds to step 235. In step 235 the wafer cassette is removed from the load/unload chamber and in step 240, the calibration gauge is moved to another slot of the wafer cassette. After step 240 the method loops back to step 205.

In one embodiment, in step 200 the calibration gauge is placed in a slot that will become the uppermost slot when the cassette is placed in the load/unload chamber (e.g., the slot closest to sender 170 of FIG. 4 which is slot 12) and in step 240 then placed in a slot that will become the lowermost slot when the cassette is placed in the load/unload chamber (e.g., the slot closest to receiver 185 of FIG. 4 which is slot 1). It should be understood after adjustments with the calibration gauge in first and second slot, measurements/adjustments with the calibration gauge back in the first slot may need to be repeated. An iterative process of two or more loops through steps 205, 210, 215, 220, 225, 235 and 240 may be performed. In another embodiment, the initial slot is a slot near the middle of the wafer cassette and a yes at step 215 goes directly to step 230.

Therefore the embodiments of the present invention provide methods and apparatus for calibrating sensors that detect wafer protrusion from a wafer cassette.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus, comprising:
   a wafer cassette comprising a top, a bottom, opposite first and second ends and opposite sidewalls between said first and second ends, said cassette open at said top and said bottom, a plurality of slots formed in said sidewalls, each slot adapted to hold a circular wafer;
   a calibration gauge in the form of a disk having a first region which is a circular sector of central angle A1 having a constant radius R1 about a center and an integral second region of increasing radius about said center, the increasing radius increasing from R1 to R2 through a central angle A2, wherein R2 is greater than R1 and A1+A2 equals 360°; and
   wherein said disk is removeably positioned in a slot of said plurality slots and rotatable about said center, said second region of said disk extending past said opposite ends and said top of said wafer cassette.

2. The apparatus of claim 1, further including:
   an optical wafer protrusion system comprising a sender for generating an optical beam and a receiver for receiving said optical beam, said sender positioned proximate to said first end of said cassette and said receiver proximate to said second end of said wafer cassette; and
   means for detecting when said beam is broken by said calibration gauge.

3. The apparatus of claim 2, further including:
   a semiconductor process tool, said semiconductor process tool having a load/unload station having a wafer cassette holder, said sender and said receiver located in said load/unload station and said load/unload station connected to a process chamber; and
   wherein said semiconductor process tool is selected from any of measurement tools, grinding tools, chemical-mechanical-polish tools, ion implantation tools, plasma etch tools, reactive ion etch tools, chemical vapor deposition tools, evaporative deposition tools, sputter deposition tools and other integrated circuit fabrication tools.

4. The apparatus of claim 1, said disk further including:
   a plurality of straight sight lines formed in or on a top surface of said disk, said sight lines extending from a perimeter of said second region, through said center to a perimeter of said first region.

5. The apparatus of claim 1, further including:
   indicia formed in or on said top surface of said disk proximate to a corresponding sight line and proximate to a perimeter of said first region.

6. The apparatus of claim 5, wherein each of said indicia indicate the length of said corresponding sight line measured from said center of said disk to said perimeter of said second region.

7. The apparatus of claim 1, wherein said increasing radius of said second region increases smoothly from R1 to R2.

8. The apparatus of claim 1, wherein R1 is equal to the radius of a semiconductor wafer said wafer cassette is designed to hold.

9. A method, comprising:
   providing a calibration gauge comprising a disk having a first region which is a circular sector of central angle A1 having a constant radius R1 about a center and an integral second region of increasing radius about said center, the increasing radius increasing from R1 to R2 through a central angle A2, wherein R2 is greater than R1 and A1+A2 equals 360°;
   providing a wafer cassette comprising a top, a bottom, opposite first and second ends and opposite sidewalls between said first and second ends, said cassette open at said top and said bottom, a plurality of slots formed in said sidewalls, each slot adapted to hold a circular wafer;
   placing said calibration gauge in a slot of said plurality of slots in said wafer cassette, said calibration gauge rotatable about said center, said second region of said disk extending past said opposite ends and said top of said wafer cassette;
   placing said wafer cassette with said calibration gauge in a load/unload station having an optical wafer protrusion system comprising a sender for generating an optical beam and a receiver for receiving said optical beam, said sender positioned proximate to said first end of said cassette and said receiver proximate to said second end of said wafer cassette; and
   rotating said calibration gauge about it center until said beam is broken by said calibration gauge and determining a difference between R1 and a distance from said center of said calibration gauge to said perimeter of said second region when said beam is broken.

10. The method of claim 9, wherein:
    said disk includes a plurality of straight sight lines formed in or on a top surface of said disk, said sight lines extending from a perimeter of said second region, through said center to a perimeter of said first region.

11. The method of claim 10, further including:
    indicia formed in or on said top surface of said disk proximate to a corresponding sight line and proximate to a perimeter of said first region.

12. The method of claim 11, wherein each of said indicia indicates a difference between R1 and a length of said corresponding sight line measured from said center of said disk to said perimeter of said second region.

13. The method of claim 9, wherein said increasing radius of said second region increases smoothly from R1 to R2.

14. The method of claim 9, wherein R1 is equal to the radius of a semiconductor wafer said wafer cassette is designed to hold.

15. The method of claim 9, wherein said load/unload station communicates with a semiconductor process chamber; and wherein said semiconductor process tool is selected from any of measurement tools, grinding tools, chemical-mechanical-polish tools, ion implantation tools, plasma etch tools, reactive ion etch tools, chemical vapor deposition tools, evaporative deposition tools, sputter deposition tools and other integrated circuit fabrication tools.

16. A device, comprising:

a disk having a first region which is a circular sector of central angle A1 having a constant radius R1 about a center and an integral second region of increasing radius about said center, the increasing radius increasing from R1 to R2 through a central angle A2, wherein R2 is greater than R1 and A1+A2 equals 360°;

a plurality of straight sight lines formed in or on a top surface of said disk, said sight lines extending from a perimeter of said second region, through said center to a perimeter of said first region; and wherein A1 is greater than 0°.

17. The device of claim 16, further including:

indicia formed in or on said top surface of said disk proximate to a corresponding sight line and proximate to a perimeter of said first region.

18. The device of claim 17, wherein each of said indicia indicate a difference between R1 and a length of said corresponding sight line measured from said center of said disk to said perimeter of said second region.

19. The device of claim 16, wherein said increasing radius of said second region.

* * * * *